(12) United States Patent
Huang

(10) Patent No.: US 7,855,550 B2
(45) Date of Patent: Dec. 21, 2010

(54) VELOCITY-DETECTING DEVICE

(75) Inventor: Jin Yi Huang, Tainan Hsien (TW)

(73) Assignee: Ya Horng Electronic Co., Ltd., Tainan Hsien (TW)

( * ) Notice: Subject to any disclaimer, the term of this patent is extended or adjusted under 35 U.S.C. 154(b) by 376 days.

(21) Appl. No.: 12/219,471

(22) Filed: Jul. 23, 2008

(65) Prior Publication Data

US 2010/0019760 A1    Jan. 28, 2010

(51) Int. Cl.
*G01P 3/50* (2006.01)
*G01P 3/56* (2006.01)
*G01R 27/26* (2006.01)

(52) U.S. Cl. .................. 324/176; 324/161; 324/686; 324/690

(58) Field of Classification Search ............. 324/161, 324/176, 658, 661–662, 686, 690
See application file for complete search history.

(56) References Cited

U.S. PATENT DOCUMENTS

| 5,880,411 A * | 3/1999 | Gillespie et al. ......... 178/18.01 |
| 2002/0134223 A1* | 9/2002 | Wesley ..................... 84/719 |
| 2007/0229466 A1* | 10/2007 | Peng et al. ................ 345/173 |
| 2008/0236374 A1* | 10/2008 | Kramer et al. ............. 84/733 |

* cited by examiner

*Primary Examiner*—Bot L LeDynh
(74) *Attorney, Agent, or Firm*—Bacon & Thomas, PLLC

(57) ABSTRACT

A velocity-detecting device is mainly based on detection of charge, including a circuit board provided thereon with at least two capacitance sensors with potential difference. The two capacitance sensors are provided at different locations for detecting the time difference when a living thing moves and has its charge respectively reaching the critical one preset by the two capacitance sensors for calculating the moving velocity of the living thing, able to detect and calculate the moving velocity of a living thing for carrying out relative reaction to a machine.

6 Claims, 2 Drawing Sheets

US 7,855,550 B2

VELOCITY-DETECTING DEVICE

BACKGROUND OF THE INVENTION

1. Field of the Invention

This invention relates to a velocity-detecting device, particularly to one based on capacitive detection and provided with different capacitance sensors for respectively detecting whether a living thing (a human body or a finger) reaches the critical charge preset by the capacitance sensors when the living thing approaches the capacitance sensors, able to quickly judge the moving velocity of the living thing.

2. Description of the Prior Art

Generally, sounds and the volume of the sounds given off by an electronic organ are mechanically controlled by a person's fingers pressed on the elastic organ keys. The organ keys have its underside provided with a first contact point and a second contact point. When the organ keys are pressed downward and respectively contact with the first and second contact point, the inner device of the electronic organ will judge the time difference of the two contact points and convert the time difference into velocity that a person's fingers touch and control the organ keys and then transmit a signal out to produce relative audio frequency. However, the drawback of such mechanical operation by having a person's fingers pressed on the organ keys is that the volume of structure is comparatively large.

SUMMARY OF THE INVENTION

In view of the drawback mentioned above and according to the fact that a living thing like a person's finger is naturally equipped with charge, the velocity-detecting device of this invention is newly designed.

The objective of this invention is to offer a velocity-detecting device based on a characteristic that a living thing is born with charge, and the device is provided with capacitance sensors able to quickly detect and calculate the moving velocity of a living thing, such as a person's finger.

The velocity-detecting device is based on detection of charge, provided with a circuit board disposed thereon with at least two capacitance sensors with potential difference. The two capacitance sensors are installed at different locations for detecting the time difference produced when a living thing moves and has its charge respectively reaching a critical one preset by the two capacitance sensors, able to detect and calculate the moving velocity of the living thing for performing relative reaction to a machine.

BRIEF DESCRIPTION OF DRAWINGS

This invention will be better understood by referring to the accompanying drawings, wherein.

DETAILED DESCRIPTION OF THE PREFERRED EMBODIMENT

Figure 1:
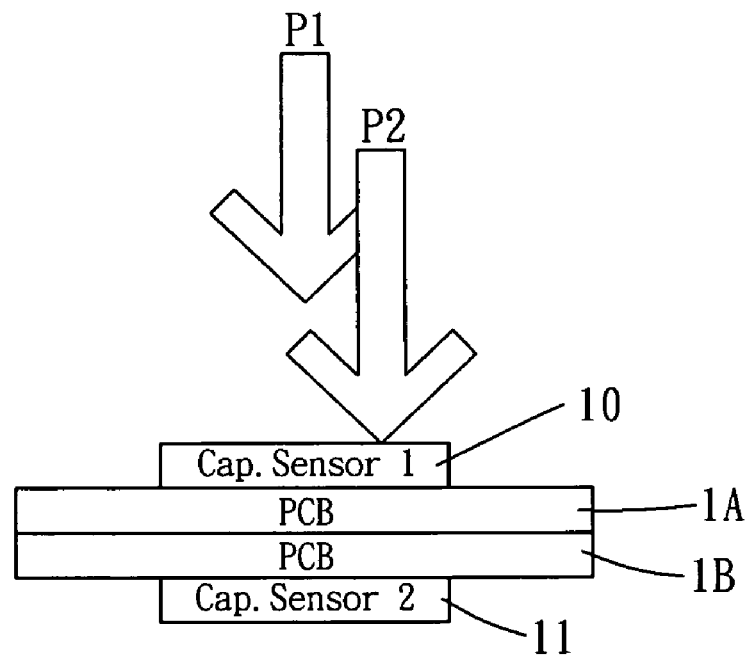
FIG. 1 is a front view of a first preferred embodiment of a velocity-detecting device in the present invention.

A first preferred embodiment of a velocity-detecting device in the present invention, as shown in FIG. 1, includes a first circuit board 1A and a second circuit board 1B closely superposed on each other, and a first capacitance sensor 10 and a second capacitance sensor 11 are respectively positioned on the topside of the first circuit board 1A and at the underside of the second circuit board 1B. The first capacitance sensor 10 communicates with the first circuit board 1A while the second capacitance sensor 11 communicates with the second circuit board 1B, and the two capacitive sensors 10, 11 are respectively preset with critical charge.

In operating and using, when a person's finger is moved downward to a position P1 to approach the first capacitance sensor 10 and reach the critical charge, the first capacitance sensor 10 will transmit a signal to a control circuit, and when the finger is continuously moved downward to another position P2 to approach the second capacitance sensor 11 and reach the critical charge, the second capacitance sensor 11 will also transmit a signal to the control circuit. By means of the time difference detected by the first and the second capacitance sensor 10 and 11 when the finger respectively reaches the critical charge of the two capacitance sensors 10, 11, the control circuit can function to calculate the moving velocity of the finger for performing relative reaction to the machine.

Figure 2:
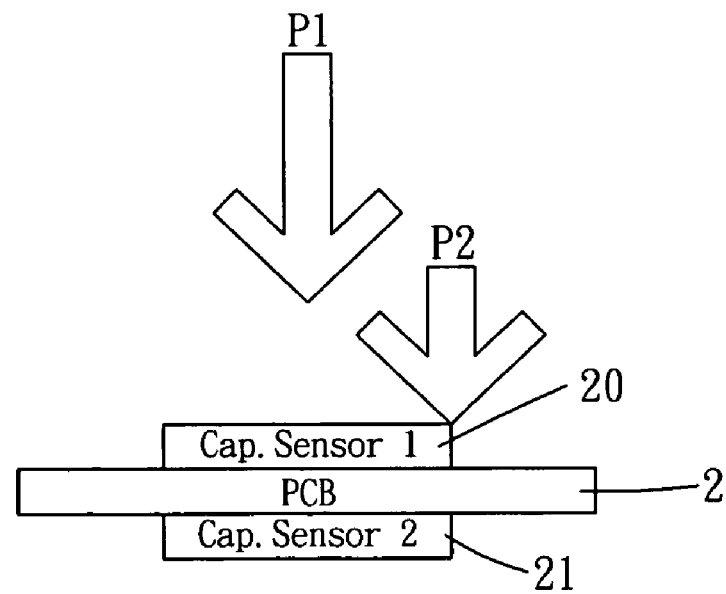
FIG. 2 is a front view of a second preferred embodiment of the velocity-detecting device in the present invention.

A second preferred embodiment of a velocity-detecting device in the present invention, in accordance with the same technical principle as described in the first preferred embodiment, as shown in FIG. 2, includes a circuit board 2, and a first capacitance sensor 20 and a second capacitance sensor 21 jointly sharing the same circuit board 2 and respectively positioned on and under the circuit board 2.

In operating and using, when a person's finger is moved downward to a position P1 to approach the first capacitance sensor 20 and reach the critical charge, the first capacitance sensor 20 will transmit a signal to a control circuit, and when the finger is continuously moved downward to another position P2 to approach the second capacitance sensor 21 and get to the critical charge, the second capacitance sensor 21 will also transmit a signal to the control circuit. In accordance with the time difference detected by the first and the second capacitance sensor 20 and 21 when the finger respectively reaches the critical charge of the two capacitance sensors 20, 21, the control circuit will simultaneously calculate the moving velocity of the finger for carrying out relative reaction to the machine.

Figure 3:
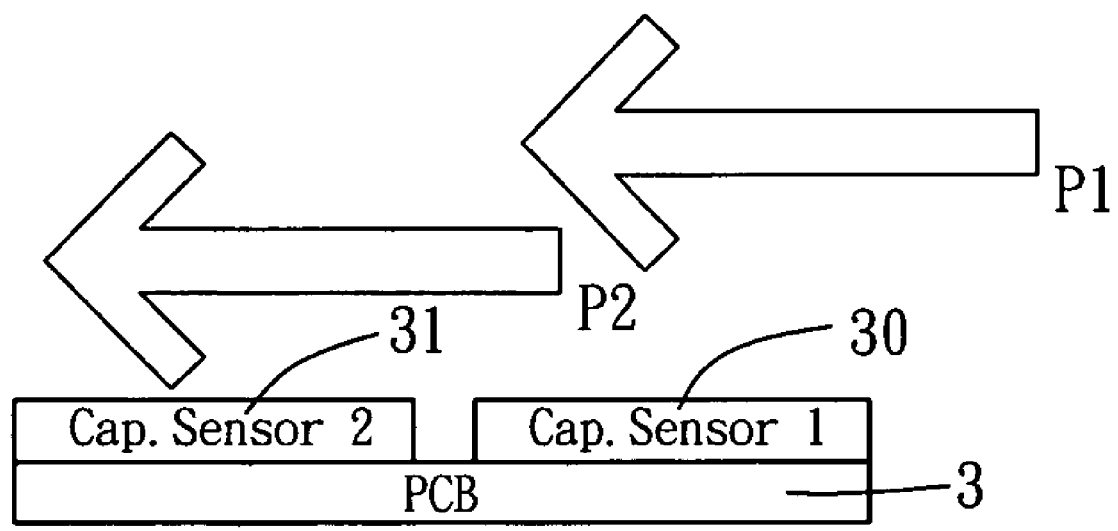
FIG. 3 is a front view of a third preferred embodiment of the velocity-detecting device in the present invention.

A third preferred embodiment of a velocity-detecting device in the present invention, according to the same technical principle as described in the second preferred embodiment, as shown in FIG. 3, includes a circuit board 3, and a first capacitance sensor 30 and a second capacitance sensor 31 respectively disposed at the front end and the rear end on the topside of the circuit board 3. Different from the capacitance sensors 10, 11, 20 and 21 in the first and the second preferred embodiment, which carry out sensing in a vertical direction, the capacitance sensors 30, 31 of the third preferred embodiment perform sensing horizontally. When a person's finger is moved horizontally from the front to the rear to a position P1 to approach the first capacitance sensor 30 and reach the critical charge, the first capacitance sensor 30 will transmit a signal to a control circuit, and when the finger is continuously moved rearwards to another position P2 to approach the second capacitance sensor 31 and get to the critical charge, the second capacitance sensor 31 will also transmit a signal to the control circuit. According to the time difference detected by the first and the second capacitance sensor 30 and 31 when the finger respectively reaches the critical charge of the two capacitance sensors 30, 31, the control circuit will figure out the moving velocity of the finger so that relative action can be performed to the machine.

To sum up, the velocity-detecting device of this invention is based on capacitive detection, provided with the circuit boards 1, 2, 3 respectively disposed thereon with the first capacitance sensors 10, 20, 30 and the second capacitance sensors 11, 21, 31. When a person's finger is moved to the position P1, the first capacitance sensor 10, 20, 30 will sense that the charge of a human body reaches the critical value preset by the first capacitance sensor, while the finger is continuously moved to the position P2, the second capacitance sensors 11, 21, 31 will also sense that the charge of the human body gets to the critical value preset by the second capacitance sensor. In accordance with the time difference sensed by the first and the second capacitance sensors 10, 11, 20, 21, 30 and 31 when the human body respectively reaches the critical charge, the moving velocity of a living thing (like a human body or a finger) can be detected and calculated for carrying out relative reaction to the machine.

While the preferred embodiments of the invention have been described above, it will be recognized and understood that various modifications may be made therein and the appended claims are intended to cover all such modifications that may fall within the spirit and scope of the invention.

I claim:

1. A velocity-detecting device comprising a circuit disposed thereon with at least two capacitance sensors with a potential difference, said two capacitance sensors provided at different locations for respectively detecting time difference when a living thing respectively reaches critical charge preset by said two capacitance sensors for calculating moving velocity of said living thing, relative reaction able to be performed to a machine according to calculated moving velocity of said living thing.

2. The velocity-detecting device as claimed in claim 1, wherein said two capacitance sensors are respectively provided on a topside and at an underside of said circuit board to form a potential difference between said two capacitance sensors.

3. The velocity-detecting device as claimed in claim 1, wherein said two capacitance sensors are respectively and separately disposed at a front end and a rear end on a topside of said circuit board to form a potential difference between said two capacitance sensors.

4. The velocity-detecting device as claimed in claim 2, wherein said circuit board is two closely superposed on each other and respectively connected with one of said capacitance sensors.

5. The velocity-detecting device as claimed in claim 2 or 3, wherein said circuit board is only one, and said two capacitance sensors jointly share said one circuit board for connecting a circuit.

6. The velocity-detecting device as claimed in claim 1, wherein said living thing can be a person's finger.

* * * * *